US012777789B2

(12) United States Patent
Ma

(10) Patent No.: US 12,777,789 B2
(45) Date of Patent: Oct. 27, 2026

(54) DISPLAY PANEL WITH TOUCH WIRING ON SIDE OF BARRIER OPPOSITE DISPLAY REGION AND DISPLAY DEVICE THEREOF

(71) Applicant: Wuhan China Star Optoelectronics Semiconductor Display Technology Co., Ltd., Wuhan (CN)

(72) Inventor: Liang Ma, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 587 days.

(21) Appl. No.: 18/275,025

(22) PCT Filed: May 12, 2023

(86) PCT No.: PCT/CN2023/094033
§ 371 (c)(1),
(2) Date: Jul. 31, 2023

(87) PCT Pub. No.: WO2024/198057
PCT Pub. Date: Oct. 3, 2024

(65) Prior Publication Data

US 2025/0008789 A1 Jan. 2, 2025

(30) Foreign Application Priority Data

Mar. 29, 2023 (CN) ......................... 202310325249.9

(51) Int. Cl.
*H10K 59/131* (2023.01)
*H10K 59/124* (2023.01)
*H10K 59/40* (2023.01)
*H10K 59/80* (2023.01)

(52) U.S. Cl.
CPC ......... *H10K 59/131* (2023.02); *H10K 59/124* (2023.02); *H10K 59/40* (2023.02); *H10K 59/873* (2023.02)

(58) Field of Classification Search
CPC .... H10K 59/131; H10K 59/124; H10K 59/40; H10K 59/873; H10K 59/8731; H10K 50/844; H10K 59/12; H10K 59/122; G09F 9/00; G06F 3/0412; H10H 20/852; H10H 29/142
See application file for complete search history.

(56) References Cited

U.S. PATENT DOCUMENTS

| | | | | |
|---|---|---|---|---|
| 2019/0019966 | A1* | 1/2019 | Jiang | H10K 59/131 |
| 2019/0095007 | A1* | 3/2019 | Jeong | H10K 59/131 |
| 2020/0279871 | A1* | 9/2020 | Lee | H10K 59/131 |
| 2024/0032390 | A1* | 1/2024 | Yu | H10K 71/00 |
| 2025/0107359 | A1* | 3/2025 | Bang | H10K 59/873 |

* cited by examiner

*Primary Examiner* — John P. Dulka

(57) ABSTRACT

The embodiments of the present invention provide a display panel and a display device, including a substrate, an inorganic insulating layer, an organic insulating layer, a light emitting layer, an encapsulation layer and a touch layer. The touch layer includes a first insulating sub-layer and a first metal sub-layer. The first insulating sub-layer is disposed between the touch wirings and the organic insulating portion of the organic insulating layer. By disposing the first insulating sub-layer, the problem of large roughness and poor flatness of surface of the layer after etching is improved, and the overall performance is improved.

20 Claims, 3 Drawing Sheets

DISPLAY PANEL WITH TOUCH WIRING ON SIDE OF BARRIER OPPOSITE DISPLAY REGION AND DISPLAY DEVICE THEREOF

RELATED APPLICATIONS

This application is a National Phase of PCT Patent Application No. PCT/CN2023/094033 having International filing date of May 12, 2023, which claims the benefit of priority of China Patent Application No. 202310325249.9 filed on Mar. 29, 2023. The contents of the above applications are all incorporated by reference as if fully set forth herein in their entirety.

TECHNICAL FIELD

The present invention relates to the field of design and manufacturing technology of display panels, and more particularly to a display panel and a display device.

BACKGROUND

With the continuous development of the manufacturing technology of display panels, people have put forward higher requirements for the performance of display panels and devices.

In the process of manufacturing display panels, a plurality of functional layers need to be formed, which correspond to different manufacturing processes, such as photomask and etching processes. Encapsulation for the functional layers is performed after the functional layers are formed, for example, forming an encapsulation layer to effectively prevent external water vapor from entering into the display panel and prevent the display panel from being damaged. A plurality of metal wirings, such as metal touch wires, are required in the display panel. The metal touch wires are usually disposed on the encapsulation layer. In the prior art, the encapsulation layer usually has a large tilt angle at the position between the display area and the bonding area. The large tilt angle causes the encapsulation layer to transition steeply in this area. When performing etching process to form metal wirings on the steep encapsulation layer, the large etching amount will make the roughness of the surface of the layers larger, and cause metal residues to remain at the position corresponding to the tilt angle, and the flatness of the formed layer is poor, which leads to short circuit problems between different metal wirings, causing the display panel to fail to work normally, reducing the reliability and overall performance of the display panel.

Therefore, solutions to the problems in the prior art are needed.

SUMMARY OF THE INVENTION

In summary, in the prior art, during the process of manufacturing a display panel, a steep tilt angle exists in the encapsulation layer in the display panel. When forming and etching the metal wirings at the tilt angle, there will be metal residues, which leads to internal short circuits in the display panel, thereby reducing the reliability and overall performance of the display panel.

To solve the above problems, the embodiments of the present application provide a display panel and a display device to effectively improve the problems of poor etching effects such as steep tilt angle of the encapsulation layer, metal residues, and poor flatness of the layer in the display panel in the prior art.

To solve the above technical problems, the present application provides a display panel comprising a display area and a non-display area disposed on a side of the display area, wherein the display panel comprises:

a substrate;

an inorganic insulating layer disposed on a surface of the substrate, the inorganic insulating layer comprising a first groove disposed in the non-display area;

an organic insulating layer disposed on a surface of the inorganic insulating layer away from the substrate, the organic insulating layer comprising a barrier disposed between the first groove and the display area, an organic insulating portion disposed on a side of the barrier away from the display area, a second groove disposed between the barrier and the organic insulating portion, and a first wiring hole disposed in the organic insulating portion and located on a side of the first groove close to the display area;

a light emitting layer disposed on a surface of the organic insulating layer away from the substrate and corresponding to the display area;

an encapsulation layer disposed on a surface of the light emitting layer away from the substrate, the encapsulation layer being disposed in the display area and extending to the non-display area, the encapsulation layer covering a part of the organic insulating portion and not extending to the first wiring hole; and a touch layer disposed on a surface of the encapsulation layer away from the substrate, the touch layer comprising a first insulating sub-layer and a first metal sub-layer, the first insulating sub-layer covering a part of the encapsulation layer and a part of the organic insulating portion, the first insulating sub-layer comprising a second wiring hole corresponding to the first wiring hole, the first metal sub-layer comprising a plurality of touch wirings, the touch wirings being disposed on a surface of the first insulating sub-layer away from the substrate and extending to the second wiring hole;

wherein the touch layer further comprises a second insulating sub-layer, the second insulating sub-layer being disposed on a surface of the encapsulation layer away from the substrate, the second insulating sub-layer being disposed in the display area and extending to the non-display area, and the outer boundary of the second insulating sub-layer in the non-display area does not exceed the boundary of the encapsulation layer.

According to an embodiment of the present application, the encapsulation layer comprises a first side surface close to the first wiring hole; wherein the first insulating sub-layer comprises a stepped slope corresponding to the first side surface;

wherein a first angle is formed between the first side surface and the substrate;

wherein a second angle is formed between the stepped slope and the substrate;

wherein the first angle and the second angle are both less than 90 degrees, and the first angle is greater than the second angle.

According to an embodiment of the present application, a thickness of the first insulating sub-layer located at the stepped slope close to the display area is greater than a thickness of the first insulating sub-layer located at the stepped slope away from the display area.

According to an embodiment of the present application, the second insulating sub-layer comprises an inorganic insulating material, and the first insulating sub-layer comprises an organic insulating material.

According to an embodiment of the present application, the touch layer further comprises:

a second metal sub-layer disposed on a surface of the second insulating sub-layer away from the substrate, the second metal sub-layer comprising a plurality of touch leads;

wherein the first insulating sub-layer covers at least part of the touch leads, the first insulating sub-layer comprising a third wiring hole disposed between the stepped slope and the display area, one end of the touch lead extending to the display area and the other end extending to the third wiring hole, at least part of the touch wirings is electrically connected to the corresponding touch leads through the third wiring holes.

According to an embodiment of the present application, the touch layer further comprises:

a third insulating sub-layer disposed between the second metal sub-layer and the first metal sub-layer, the third insulating sub-layer comprising an inorganic insulating material, the first insulating sub-layer comprising an organic insulating material, the first insulating sub-layer is only disposed in the non-display area and does not overlap with the third insulating sub-layer;

wherein the first metal sub-layer comprises a plurality of touch electrodes disposed in the display area;

wherein the third insulating sub-layer comprises a plurality of fourth wiring holes, and part of the touch electrodes are electrically connected to the corresponding touch leads through the fourth wiring holes.

According to an embodiment of the present application, the first insulating sub-layer further covers the display area and is disposed between the second metal sub-layer and the first metal sub-layer, the first insulating sub-layer further comprises a fifth wiring hole disposed in the third wiring hole close to the display area;

wherein the first metal sub-layer comprises a plurality of touch electrodes disposed in the display area, and part of the touch electrodes are electrically connected to the corresponding touch leads through the fifth wiring holes.

According to an embodiment of the present application, the first angle ranges from 75° to 90°, and the second angle ranges from 30° to 60°.

According to an embodiment of the present application, in the surface of the organic insulating portion away from the substrate, the roughness of the surface of the area not covered by the encapsulation layer is greater than the roughness of the surface of the area covered by the encapsulation layer.

The present application also provides a display panel comprising a display area and a non-display area disposed on a side of the display area, wherein the display panel comprises:

a substrate;

an inorganic insulating layer disposed on a surface of the substrate, the inorganic insulating layer comprising a first groove disposed in the non-display area;

an organic insulating layer disposed on a surface of the inorganic insulating layer away from the substrate, the organic insulating layer comprising a barrier disposed between the first groove and the display area, an organic insulating portion disposed on a side of the barrier away from the display area, a second groove disposed between the barrier and the organic insulating portion, and a first wiring hole disposed in the organic insulating portion and located on a side of the first groove close to the display area;

a light emitting layer disposed on a surface of the organic insulating layer away from the substrate and corresponding to the display area;

an encapsulation layer disposed on a surface of the light emitting layer away from the substrate, the encapsulation layer being disposed in the display area and extending to the non-display area, the encapsulation layer covering a part of the organic insulating portion and not extending to the first wiring hole; and a touch layer disposed on a surface of the encapsulation layer away from the substrate, the touch layer comprising a first insulating sub-layer and a first metal sub-layer, the first insulating sub-layer covering a part of the encapsulation layer and a part of the organic insulating portion, the first insulating sub-layer comprising a second wiring hole corresponding to the first wiring hole, the first metal sub-layer comprising a plurality of touch wirings, the touch wirings being disposed on a surface of the first insulating sub-layer away from the substrate and extending to the second wiring hole.

According to an embodiment of the present application, the encapsulation layer comprises a first side surface close to the first wiring hole; wherein the first insulating sub-layer comprises a stepped slope corresponding to the first side surface;

wherein a first angle is formed between the first side surface and the substrate;

wherein a second angle is formed between the stepped slope and the substrate;

wherein the first angle and the second angle are both less than 90 degrees, and the first angle is greater than the second angle.

According to an embodiment of the present application, a thickness of the first insulating sub-layer located at the stepped slope close to the display area is greater than a thickness of the first insulating sub-layer located at the stepped slope away from the display area.

According to an embodiment of the present application, the touch layer further comprises: a second insulating sub-layer disposed on a surface of the encapsulation layer away from the substrate, the second insulating sub-layer being disposed in the display area and extending to the non-display area, the outer boundary of the second insulating sub-layer in the non-display area does not exceed the boundary of the encapsulation layer; wherein the first insulating sub-layer covers a part of the second insulating sub-layer and a part of the organic insulating portion.

According to an embodiment of the present application, the second insulating sub-layer comprises an inorganic insulating material, and the first insulating sub-layer comprises an organic insulating material.

According to an embodiment of the present application, the touch layer further comprises:

a second metal sub-layer disposed on a surface of the second insulating sub-layer away from the substrate, the second metal sub-layer comprising a plurality of touch leads;

wherein the first insulating sub-layer covers at least part of the touch leads, the first insulating sub-layer comprises a third wiring hole disposed between the stepped slope and the display area, one end of the touch lead extends to the display area and the other end extending to the third wiring hole, at least part of the touch wirings are electrically connected to the corresponding touch leads through the third wiring holes.

According to an embodiment of the present application, the touch layer further comprises:

a third insulating sub-layer disposed between the second metal sub-layer and the first metal sub-layer, the third insulating sub-layer comprising an inorganic insulating material, the first insulating sub-layer comprising an organic insulating material, the first insulating sub-layer is only disposed in the non-display area and does not overlap with the third insulating sub-layer;

wherein the first metal sub-layer comprises a plurality of touch electrodes disposed in the display area;

wherein the third insulating sub-layer comprises a plurality of fourth wiring holes, and part of the touch electrodes are electrically connected to the corresponding touch leads through the fourth wiring holes.

According to an embodiment of the present application, the first insulating sub-layer further covers the display area and is disposed between the second metal sub-layer and the first metal sub-layer, the first insulating sub-layer further comprises a fifth wiring hole disposed in the third wiring hole and close to the display area;

wherein the first metal sub-layer comprises a plurality of touch electrodes disposed in the display area, and part of the touch electrodes are electrically connected to the corresponding touch leads through the fifth wiring holes.

According to an embodiment of the present application, the first angle ranges from 75° to 90°, and the second angle ranges from 30° to 60°.

According to an embodiment of the present application, in the surface of the organic insulating portion away from the substrate, the roughness of the surface of the area not covered by the encapsulation layer is greater than the roughness of the surface of the area covered by the encapsulation layer.

The present application also provides a display device comprising a display panel provided in the embodiments of the present application.

Advantageous Effects

In summary, compared with the prior art, the embodiments of the present invention provide a display panel and a display device, the display panel includes a display area and a non-display area, a substrate, an inorganic insulating layer, an organic insulating layer, a light emitting layer, an encapsulation layer and a touch layer, the touch layer includes a first insulating sub-layer and a first metal sub-layer, the first metal sub-layer includes a plurality of touch wirings, and the first insulating sub-layer includes a second wiring hole corresponding to the first wiring hole, and the touch wirings are disposed on a surface of the first insulating sub-layer away from the substrate and extend to the second wiring hole. In the embodiments of the present application, after the encapsulation layer is etched, by forming the first insulating sub-layer, the problems of large roughness of the surface of the layers after etching and poor flatness and metal residue are improved, thereby improving the overall performance of the display panel.

DETAILED DESCRIPTION OF THE EMBODIMENTS

The description of the following embodiments refers to the accompanying drawings, which illustrate specific embodiments that can be implemented in the present application.

With the continuous development of display panel and device manufacturing technology, higher requirements have been put forward for the performance and display effect of display devices.

Figure 1:
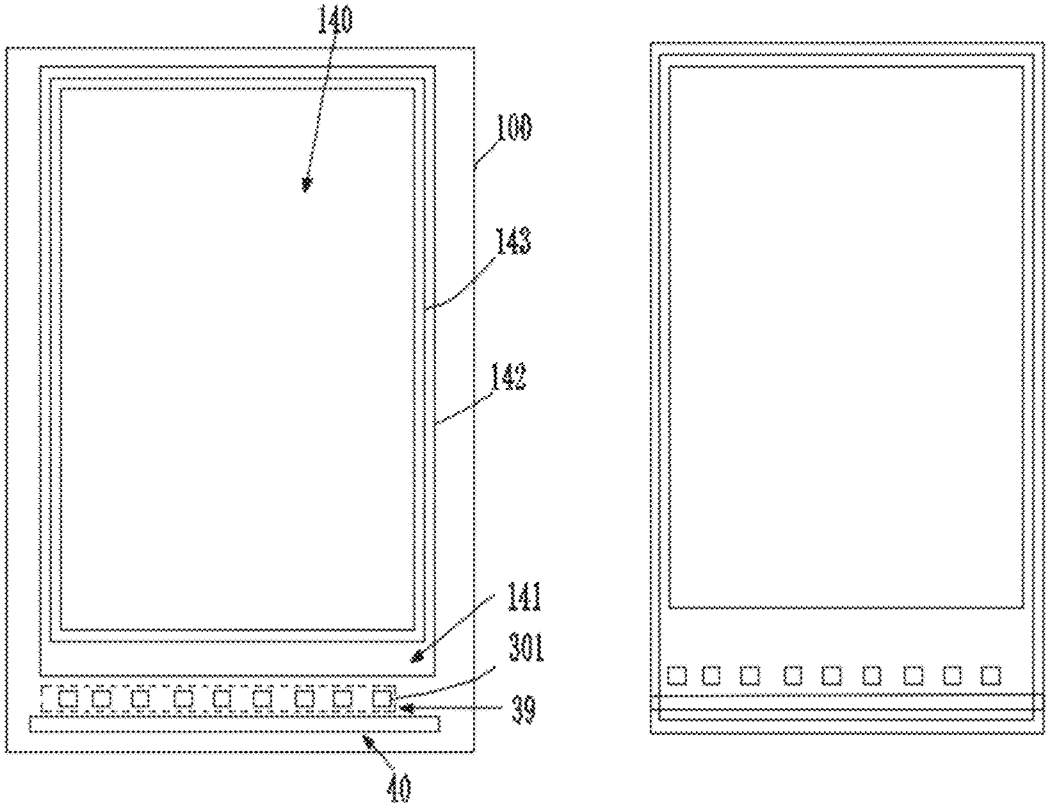
FIG. 1 is a schematic plan view illustrating the structure of a display panel provided in the prior art.

Compared with the traditional display panel, as shown in FIG. 1, FIG. 1 is a schematic plan view illustrating the structure of a display panel provided in the prior art. Functional layers of the display panel 100 need to be encapsulated after the functional layers of the display panel 100 are formed. The display panel 100 includes a display area 140 and a non-display area 141. In the embodiments of the present application, a wiring area 39 and a bending area 40 are provided in the non-display area 141. Wherein, a plurality of first wiring holes K1 are provided in the wiring area 39, and the wiring area 39 is provided on a side close to the display area 140, and the bending area 40 is provided on a side close to the edge of the display panel 100. The display panel 100 is also provided with an encapsulation layer 20. Specifically, the encapsulation layer 20 is provided in the display area 140 and extends into the non-display area 141, for example, the encapsulation layer 20 extends into the bending area 40 in the non-display area 141. The encapsulation layer 20 includes an inner boundary 143 and an outer boundary 142. An encapsulation area with a certain width is formed between the inner boundary 143 of the encapsulation layer 20 and the outer boundary 142 of the encapsulation layer 20 to effectively encapsulating the display panel 100.

A plurality of wiring holes 301 are provided in the bonding area of the display panel 100, and a metal layer disposed on the encapsulation layer 20 is electrically connected to the array substrate 119 through the wiring holes 301. However, in the prior art, when etching the encapsulation layer 20, due to the large tilt angle of the encapsulation layer 20 at the inner boundary 143 and the outer boundary 142, the etching amount of the encapsulation layer 20 at these portions are large, resulting in metal residues, and leading to large surface roughness and poor flatness of the layer after etching. If a touch metal layer is formed on the encapsulation layer 20, short circuits are likely to occur between the touch metal layer and other metals, which reduces the reliability and overall performance of the display panel 100.

The embodiments of the present application provide a display panel and a display device to effectively improve the problem of unsatisfactory etching effect in the etching area due to the large inclination angle after etching the encapsulation layer 20 of the display panel 100 and the poor flatness of the etched layer during the etching process of the encapsulation layer 20 of the display panel 100.

Figure 2:
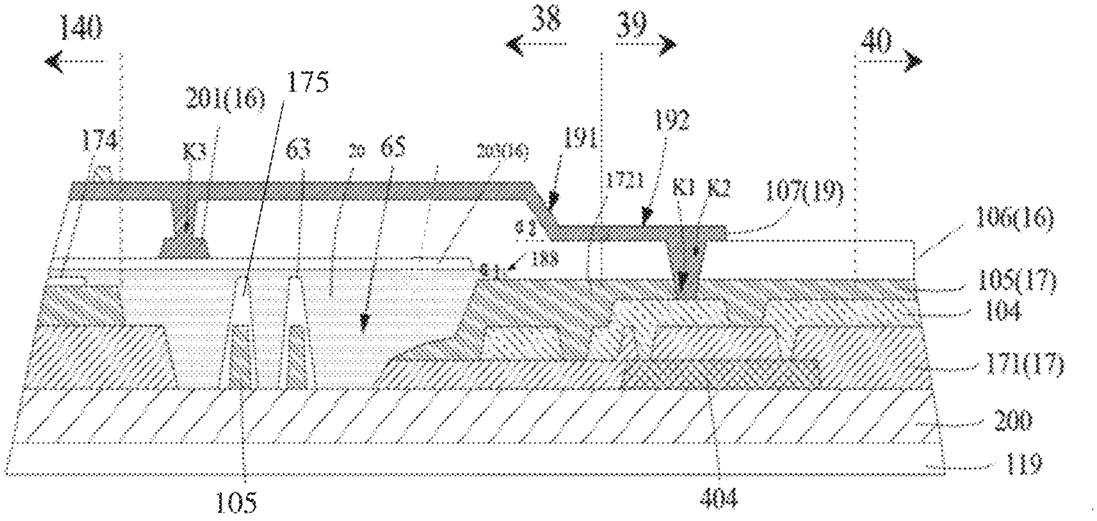
FIG. 2 is a schematic view illustrating the layer structure of a display panel provided in the embodiments of the present application.

As shown in FIG. 2, FIG. 2 is a schematic view illustrating the layer structure of a display panel 100 provided in the embodiments of the present application. The layer structure described in the following embodiments is a layer structure located in the encapsulation area. The display panel 100 includes a substrate and a plurality of functional layers disposed on the substrate. Specifically, the display panel 100 includes a substrate and functional layers disposed on the substrate.

Specifically, in the following embodiments, the substrate is described as an example of a conventional array substrate.

FIG. 2 is a schematic view illustrating the layer structure of a partial area of the display panel 100. Specifically, FIG. 2 schematically shows a part of the display area 140, a wiring area 39 and a part of bending area 40 of the display panel 100. The display panel 100 includes a substrate 119, an inorganic insulating layer 200, an organic insulating layer 17, a first signal wiring layer 404, a barrier 63, a second signal wiring layer 104, a light emitting layer 174, a pixel definition layer 175, and an encapsulation layer 20.

Specifically, the inorganic insulating layer 200 is disposed on the array substrate 119, the first signal wiring layer 404 is disposed on the organic insulating layer 200. In the embodiments of the present application, the organic insulating layer 17 is illustrated by taking the first planarization layer 171 and the second planarization layer 105 as examples.

Specifically, the first planarization layer 171 is disposed on the inorganic insulating layer 200 and covers the first signal wiring layer 404. The second signal wiring layer 104 is disposed on the first planarization layer 171, the second planarization layer 105 is disposed on the first planarization layer 171, and covers the second signal wiring layer 104.

In the embodiments of the present application, the inorganic insulating layer 200, the first planarization layer 171 and the second planarization layer 105 are all disposed in the display area 140 and extend into the non-display area 141. In the non-display area 141, the inorganic insulating layer 200 further includes a first groove. The structure of the first groove is not shown in FIG. 2. The first groove is disposed in the bending area 40 corresponding to the non-display area 141, for example, the first groove is disposed on a side of the bending area 40 away from the display area 140. By providing the first groove in the bending area 40, the first groove can remove some materials of part of the inorganic insulating layer 200, thereby reducing the bending stress required when the display panel 100 is bent and improving the bending performance of the display panel 100, and realizing cross connection of different signal wirings through the first groove.

The first signal wiring layer 404 can be formed in the same layer as the source/drain metal layer in the display area 140 of the array substrate 119 when forming the first signal wiring layer 404 in the non-display area 141. For example, when forming the first source/drain metal layer of the array substrate 119, the first source/drain metal layer corresponds to the non-display area 141 is the first signal wiring layer 404, when forming the second source/drain metal layer of the array substrate 119, the second source/drain metal layer corresponds to the non-display area 141 is the second signal wiring layer 104. Thus, the transmissions of the control signals are realized through the first signal wiring layer 404 and the second signal wiring layer 104, and the normal operation of the display panel 100 is ensured.

In the embodiments of the present application, in the non-display area 141, the second signal wiring layer 104 is disposed in the wiring area 39 to realize signal transmission. The second signal wiring layer 104 is electrically connected to the first signal wiring layer 404, for example, the first signal wiring layer 404 and the second signal wiring layer 104, which belong to two different signal wiring layers, are electrically connected through the via hole structure.

Refer to FIG. 2, the second planarization layer 105 includes a barrier 63 disposed between the first groove and the display area 140, and an organic insulating portion 1721 disposed on a side of the barrier 63 away from the display area 140.

Further, a second groove 65 and a first wiring hole K1 are disposed between the barrier 63 and the organic insulating portion 1721, the first wiring hole K1 is disposed on a side of the organic insulating portion 1721 away from the second groove 65. In the embodiments of the present application, the first wiring hole K1 is disposed in the wiring area 39, and penetrates the second planarization layer 105 to realize electrical connection between different signal wirings.

In the embodiments of the present application, the light emitting layer 174 is disposed in the display area 140 and on a surface of the second planarization layer 105 away from the substrate 119. A pixel defining layer 175 is also provided corresponding to the light emitting layer 174. In the embodiments of the present application, in the area of the second groove 65, the pixel defining layer 175 overlaps with the second planarization layer 105 to form the barrier 63 in the embodiments of the present application.

Further, the encapsulation layer 20 is disposed on a surface of the light emitting layer 174 away from the substrate 119. The encapsulation layer 20 is disposed in the display area 140 and extends into the non-display area 141. Since the barrier 63 is formed in the non-display area 141 by an etching process, the protruding barrier 63 can further increase the contact area between the encapsulation layer 20 and other layers, thereby improving the encapsulation effect. In the embodiments of the present application, the area corresponding to the barrier 63 is the effective encapsulation area 38 of the display panel 100, which is configured to ensure the sealing effect of the display panel 100.

In the embodiments of the present application, the encapsulation layer 20 at least covers part of the organic insulating portion 1721 of the second planarization layer 105, and the encapsulation layer 20 does not extend to the first wiring hole K1. The encapsulation layer 20 covers the second groove 65, and directly contacts and seals the surface of the inorganic insulating layer 200 away from the substrate 119 in this area. A thickness of the encapsulation layer 20 at the second groove 65 is greater than a thickness of the encapsulation layer 20 corresponding to the organic insulating portion 1721.

Further, the touch layer of the display panel 100 is disposed on a surface of the encapsulation layer 20 away from the substrate 119 to realize the touch function of the display panel 100. In the embodiments of the present application, the touch layer 16 includes a first insulating sub-layer 106, a second insulating sub-layer 203, a first metal sub-layer 19, and a second metal sub-layer 201. The first metal sub-layer 19 includes a plurality of touch wirings 107.

The second insulating sub-layer 203 is disposed on a surface of the encapsulation layer 20 away from the substrate 119, the second metal sub-layer 201 is disposed on the second insulating sub-layer 203, the first insulating sub-layer 106 is disposed on the second insulating sub-layer 203, and covers the second metal sub-layer 201. The touch wiring 107 are disposed on the first insulating sub-layer 106.

In the embodiments of the present application, the first insulating sub-layer 106 further includes a second wiring hole K2 corresponding to the first wiring hole K1. For example, the second wiring hole K2 is disposed above the first wiring hole K1 and connects with the first wiring hole K1. The touch wirings 107 extend to the second wiring hole K2 and is electrically connected to the second signal wiring layer 104 through the first wiring hole K1 and the second wiring hole K2 to realize the transmission of the touch signal.

In the embodiments of the present application, the first insulating sub-layer 106 covers a part of the encapsulation layer 20 and a part of the organic insulating portion 1721. Due to the large etching amount for the encapsulation layer 20 during the etching process, in the surface of the organic insulating portion 1721 away from the substrate 119, the roughness of the surface of the area not covered by the encapsulation layer 20 is greater than the roughness of the surface of the area covered by the encapsulation layer 20.

Specifically, the roughness of the surface of the area of the organic insulating portion 1721 not covered by the encapsulation layer 20 is 5-11.5, while the roughness of the surface of the area of the organic insulating portion 1721 covered by the encapsulation layer 20 is 1.5-3.5. Optionally, the roughness of the surface of the area of the organic insulating portion 1721 not covered by the encapsulation layer 20 is 6, 8 or 10. The roughness of the surface of this area is large and the flatness is poor, which is not conducive to the deposition of other layers. In addition, there may be residual metal left due to over-etching. The roughness of the surface of the area of the organic insulating portion 1721 covered by the encapsulation layer 20 is 1.6 or 2. Since the surface of this area is not etched, the roughness of the surface of this area is small and the flatness is good.

Therefore, in the embodiments of the present application, by providing the first insulating sub-layer 106, the organic insulating layer in the area not covered by the encapsulation layer 20 can be covered again by the first insulating sub-layer 106. Thereby achieving coverage of layers with larger roughness and ensuring the flatness of subsequent layers.

Refer to FIG. 2. in the embodiments of the present application, the encapsulation layer 20 includes a first side surface 188 on the edge away from the display area 140, such as near the first wiring hole K1. In the embodiments of the present application, the encapsulation layer 20 is provided with an organic-inorganic laminated structure. When the above-mentioned encapsulation layer 20 provided with organic-inorganic laminated structure is etched, a flush first side surface 188 is formed at the edge of the encapsulation layer 20 by the etching process. Here is not repeated.

Further, in the embodiments of the present application, the first insulating sub-layer 106 includes a stepped slope 191 corresponding to the first side surface 188.

A first angle $\alpha 1$ is formed between the first side surface 188 and the substrate 119 when forming the first side surface 188 and the first insulating sub-layer 106. That is, the first angle $\alpha 1$ is an acute angle formed between the plane corresponding to the first side surface 188 and the plane corresponding to the surface of the substrate 119. Similarly, a second angle $\alpha 2$ is formed between the stepped slope 191 and the substrate 119.

The first angle $\alpha 1$ and second angle $\alpha 2$ are both acute angles formed between the corresponding planes, that is, the first angle $\alpha 1$ and the second angle $\alpha 2$ are both less than 90°. And the first angle $\alpha 1$ is greater than the second angle $\alpha 2$.

Specifically, the first angle $\alpha 1$ ranges from 75° to 90°, and the second angle $\alpha 2$ ranges from 30° to 60°. Optionally, the first angle $\alpha 1$ is 80°, while the second angle $\alpha 2$ is 50°. Further, in order to reduce the discontinuity of the stepped slope 191, providing the difference between the first angle $\alpha 1$ and the second angle $\alpha 2$ less than or equal to 30° when forming the first angle $\alpha 1$ and the second angle $\alpha 2$, thereby avoiding the stepped slope 191 being too steep caused by the second angle $\alpha 2$ being too large as the first angle $\alpha 1$ being too large, which is not conducive to form other layers.

Further, a thickness of the first insulating sub-layer 106 located at the stepped slope 191 on a side close to the display area 140 is greater than a thickness of the first insulating sub-layer 106 located at the stepped slope 191 on a side away from the display area 140.

Further, the second insulating sub-layer 203 is disposed in the display area 140 and extends into the non-display area 141. For example, the outer boundary of the second insulating sub-layer 203 in the non-display area does not exceed the boundary of the encapsulation layer 20.

In one embodiment of the present application, the outer boundary of the second insulating sub-layer 203 is flush with the boundary of the encapsulation layer 20 away from the display area 140, in which case the second insulating sub-layer 203 forms the same first side surface 188 with the encapsulation layer 20.

Further, the first insulating sub-layer 106 covers a part of the second insulating sub-layer 203 and a part of the organic insulating portion 1721.

In the embodiments of the present application, the first insulating sub-layer 106 and the second insulating sub-layer 203 are made of organic or inorganic materials. Optionally, the first insulating sub-layer 106 are made of organic insulating layer material, and the second insulating sub-layer 203 are made of inorganic insulating material. By making the first insulating sub-layer 106 with organic insulating material, better flatness of the first insulating sub-layer 106 is achieved and the flatness of its upper surface is ensured.

Refer to FIG. 2. In the embodiments of the present application, the first insulating sub-layer 106 further includes a third wiring hole K3. The third wiring hole K3 is disposed at a position between the stepped slope 191 and the display area 140. The second metal sublayer 201 includes a plurality of touch leads. The first insulating sub-layer 106 covers at least part of the touch leads. In the embodiments of the present application, one end of the touch lead extends into the display area 140, and the other end extends into the third wiring hole K3. Optionally, at least part of the touch wirings is electrically connected to the corresponding touch leads through the third wiring holes K3. In the embodiments of the present application, by providing the third wiring hole K3, connection of the touch wirings in different layers can be realized, and the layout area of the touch wirings can be effectively reduced to achieve a narrow bezel display panel 100.

In one embodiment of the present application, the first insulating sub-layer 106 is provided only in the non-display area 141. The touch layer further includes a third insulating sub-layer disposed between the second metal sub-layer 201 and the first metal sub-layer 19. The third insulating sub-layer is made of inorganic insulating material, while the first insulating sub-layer 106 is made of organic insulating material. The first insulating sub-layer 106 is only disposed in the non-display area 141 and does not overlap with the third insulating sub-layer.

The third insulating sub-layer further includes a plurality of fourth wiring holes (the fourth wiring holes are not shown in the drawings), for example, a plurality of fourth wiring holes are correspondingly disposed on a side of the third wiring hole K3 close to the display area 140. The first metal sub-layer 19 further includes a plurality of touch electrodes disposed in the display area 140. The third insulating sub-layer and the corresponding touch electrodes are not shown in FIG. 2. Some touch electrodes electrically connect with the touch leads below through the fourth wiring holes, and then electrically connect with the corresponding touch leads above. Thereby realizing the connection of the touch signals in different layers through different wiring holes, and ensuring the overall performance of the display panel 100.

In another embodiment of the present application, the first insulating sub-layer 106 covers a part of the display area 140 and is disposed between the second metal sub-layer 201 and the first metal sub-layer 19. The first insulating sub-layer 106 includes a fifth wiring hole (the fifth wiring hole is not shown in the drawings) disposed on the side of the third wiring hole K3 close to the display area 140. The first metal sub-layer 19 includes a plurality of touch electrodes disposed in the display area 140. Refer to the above embodiments, some touch electrodes are electrically connected to the corresponding touch leads through the fifth wiring holes. Thereby realizing the connection of the touch signals in different layers through different wiring holes, and ensuring the overall performance of the display panel 100.

Figure 3:
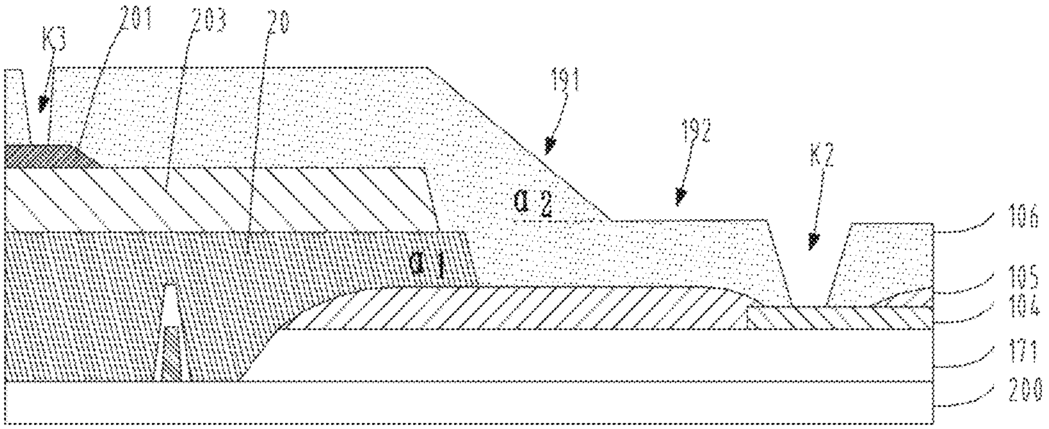
FIG. 3 is a schematic view illustrating the layer structure of a partial area of the display panel provided in the embodiments of the present application.

As shown in FIG. 3, FIG. 3 is a schematic view illustrating the layer structure of a partial area of the display panel 100 provided in the embodiments of the present application. Specifically, the touch layer further includes a transition platform 192. The transition platform 192 is connected to the stepped slope 191 and disposed on a side away from the display area 140. The transition platform 192 is a horizontal plane, and the transition platform 192 is parallel to the upper surface of the substrate 119.

In combination with the structure in FIG. 2, in the embodiments of the present application, the orthogonal projection of the first side surface 188 on the substrate 119 overlaps with the orthogonal projection of the stepped slope 191 on the substrate 119. Specifically, the projection of the first side surface 188 locates within the orthogonal projection of the stepped slope 191. And the slope length of the stepped slope 191 is greater than the length of the first side surface 188. Thereby ensuring the inclination of the stepped slope 191 and ensuring its etching effect.

Figure 4:
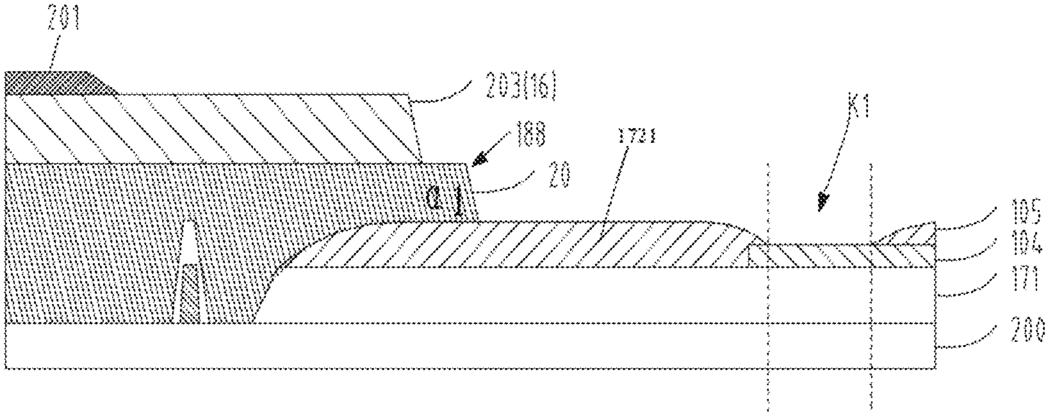
FIG. 4 to FIG. 6 are schematic views illustrating the manufacturing process of the display panel provided in the embodiments of the present application.
Figure 5:
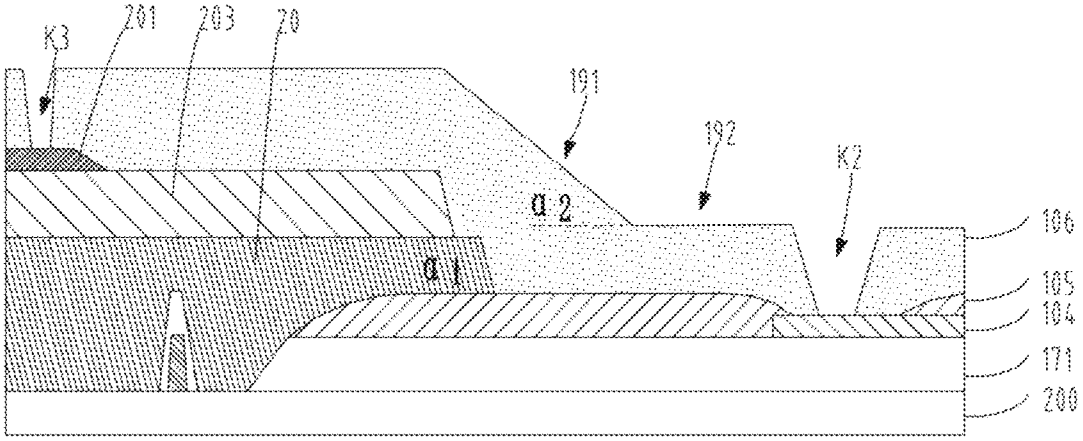
Figure 6:
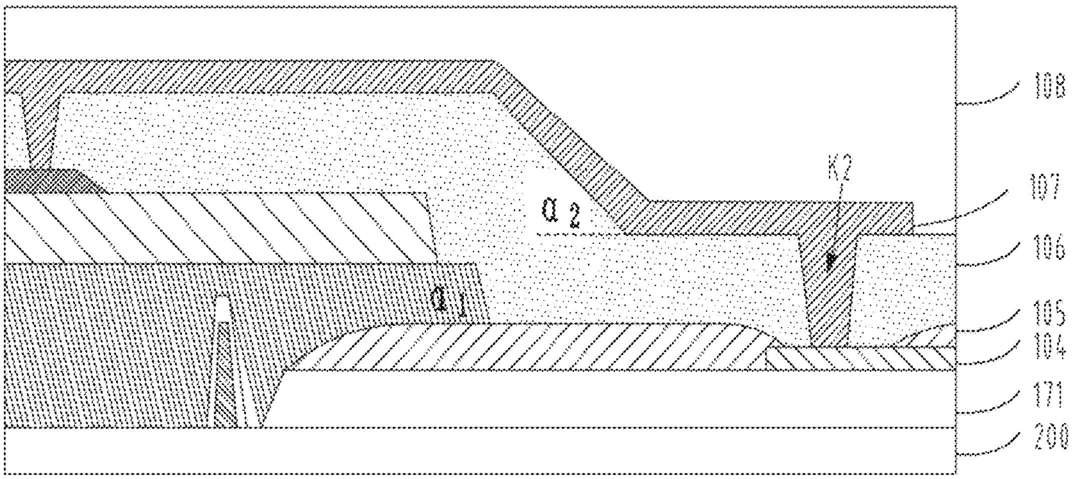

As shown in FIGS. 4-6, FIG. 4 to FIG. 6 are schematic views illustrating the manufacturing process of the display panel 100 provided in the embodiments of the present application. The illustrated structure is a layer structure in a partial area of the display panel 100. FIG. 4 to FIG. 6 illustrate the manufacturing process of a second planarization layer 105, an encapsulation layer 20 and layers thereon as an example. Other layers not shown can be formed according to a conventional manufacturing process, which will not be repeated here.

Refer to FIG. 4. Depositing each layer in sequence. Specifically, forming an array substrate 119 according to manufacturing processes of a conventional array substrate. Then depositing an inorganic insulating layer 200 on the substrate 119, and then depositing a second signal wiring layer 104 and a first planarization layer 105 on the inorganic insulating layer 200, and patterning and etching the first planarization layer 105. The first planarization layer 105 covers the second signal wiring layer 104.

Further, depositing an encapsulation layer 20 on the inorganic insulating layer 200. Etching the encapsulation layer 20 after the deposition of the above layers is completed, and forming a first side surface 188 of the encapsulation layer 20 on a side away from the display area 140, and forming a first wiring hole K1 at a position corresponding to the wiring area 39.

Refer to FIG. 5. After etching the encapsulation layer 20, depositing a touch layer 16 on the encapsulation layer 20. Specifically, forming a second insulating sub-layer 203 on the encapsulation layer 20. The second insulating sub-layer 203 is disposed in the display area 140 and extends into the non-display area 141. Then, forming a second metal sub-layer 201 on the second insulating sub-layer 203. Forming a first insulating sub-layer 106 on the second insulating sub-layer 203 after the deposition of the second metal sub-layer 201 is completed, the first insulating sub-layer 106 covers the second metal sub-layer 201. And performing dry etching for the first insulating sub-layer 106 to form a second wiring hole K2 and a third wiring hole K3.

In the embodiments of the present application, the first insulating sub-layer 106 includes a stepped slope 191. The acute angle formed between the stepped slope 191 and the horizontal plane of the substrate 119 is the second angle $\alpha 2$. The second angle $\alpha 2$ ranges from 30° to 60°. Thereby making the inclination of the stepped slope 191 smaller, facilitating the deposition of other layers thereon, and ensuring the performance of the layers.

Refer to FIG. 6. Forming the touch wirings 107 on the first insulating sub-layer 106 after the first insulating sub-layer 106 is formed. The touch wirings 107 are deposited on the first insulating sub-layer 106 and extends to the second wiring hole K2. The touch wirings 107 are electrically connected to the second signal wiring layer 104 below through the second wiring hole K2 and the first wiring hole K1 to realize the transmission of the touch signal.

After the touch layer is formed, depositing an insulating protective layer 108 on the touch layer. The insulating protective layer 108 completely covers the touch wirings 107 of the touch layer for protection. Finally, a touch display panel provided in the embodiments of the present application is formed.

In the embodiments of the present application, the first insulating sub-layer 106 is configured to improve the height of the terrain formed after the etching of the encapsulation layer 20 is completed, and to further reduce its etching tilt angle through the stepped slope, thereby ensuring that the touch wirings 107 smoothly transition over the first insulating sub-layer 106, ensuring etching effects of each layer, and preventing problems such as fracture of the touch layer.

Further, the embodiments of the present application further provide a display device. The display device includes a display panel 100 provided in the embodiments of the present application. The encapsulation layer 20 and other layers in the display panel 100 are formed according to the structure provided in the embodiments of the present application. By forming different insulating layers to reduce the etching tilt angle and effectively improve the etching effect during the manufacturing process of the display panel 100, problems such as large roughness and poor flatness of the surface of the layer during the etching process can be avoided, thereby effectively improving the etching effect and overall performance of the display panel 100.

In the embodiments of the present application, the flexible display device can be any product or component having a display function or touch operation function such as a foldable mobile phone, computer, electronic paper, display, etc. The specific type is not specifically limited.

In summary, the above describes a display panel 100 and a display device provided in the embodiments of the present invention in detail. Specific examples are used to explain the principles and embodiments of the present application.

The above embodiments are only used to help understand the technical solutions and core ideas of the present application. Although the present invention discloses the preferred embodiments as above, the above preferred embodiments are not intended to limit the present application. Changes and modifications made by ordinary skilled in the art shall fall within the scope of protection of the present application defined by the claims.

What is claimed is:

1. A display panel comprising a display area and a non-display area disposed on a side of the display area, wherein the display panel comprises:

a substrate;

an inorganic insulating layer disposed on a surface of the substrate, the inorganic insulating layer comprising a first groove disposed in the non-display area;

an organic insulating layer disposed on a surface of the inorganic insulating layer away from the substrate and is disposed in the display area and extends into the non-display area, the organic insulating layer comprising a barrier disposed between the first groove and the display area, an organic insulating portion disposed on a side of the barrier away from the display area, a second groove disposed between the barrier and the organic insulating portion and disposed in the organic insulating layer, and a first wiring hole disposed in the organic insulating portion and located on a side of the first groove close to the display area;

a light emitting layer disposed on a surface of the organic insulating layer away from the substrate and corresponding to the display area;

an encapsulation layer disposed on a surface of the light emitting layer away from the substrate, the encapsulation layer being disposed in the display area and extending to the non-display area, the encapsulation layer covering a part of the organic insulating portion and not extending to the first wiring hole; and a touch layer disposed on a surface of the encapsulation layer away from the substrate, the touch layer comprising a first insulating sub-layer and a first metal sub-layer, the first insulating sub-layer covering a part of the encapsulation layer and a part of the organic insulating portion, the first insulating sub-layer comprising a second wiring hole corresponding to the first wiring hole, the first metal sub-layer comprising a plurality of touch wirings, the touch wirings being disposed on a surface of the first insulating sub-layer away from the substrate and extending to the second wiring hole;

wherein the touch layer further comprises a second insulating sub-layer, the second insulating sub-layer being disposed on a surface of the encapsulation layer away from the substrate, the second insulating sub-layer being disposed in the display area and extending to the non-display area, and the outer boundary of the second insulating sub-layer in the non-display area does not exceed the boundary of the encapsulation layer.

2. The display panel according to claim 1, wherein the encapsulation layer comprises a first side surface close to the first wiring hole;

wherein the first insulating sub-layer comprises a stepped slope corresponding to the first side surface;

wherein a first angle is formed between the first side surface and the substrate;

wherein a second angle is formed between the stepped slope and the substrate;

wherein the first angle and the second angle are both less than 90 degrees, and the first angle is greater than the second angle.

3. The display panel according to claim 2, wherein a thickness of the first insulating sub-layer located at the stepped slope close to the display area is greater than a thickness of the first insulating sub-layer located at the stepped slope away from the display area.

4. The display panel according to claim 2, wherein the first angle ranges from 75° to 90°, and the second angle ranges from 30° to 60°.

5. The display panel according to claim 1, wherein the second insulating sub-layer comprises an inorganic insulating material, and the first insulating sub-layer comprises an organic insulating material.

6. The display panel according to claim 1, wherein the touch layer further comprises:

a second metal sub-layer disposed on a surface of the second insulating sub-layer away from the substrate, the second metal sub-layer comprising a plurality of touch leads;

wherein the first insulating sub-layer covers at least part of the touch leads, the first insulating sub-layer comprising a third wiring hole disposed between the stepped slope and the display area, one end of the touch lead extending to the display area and the other end extending to the third wiring hole, at least part of the touch wirings is electrically connected to the corresponding touch leads through the third wiring hole.

7. The display panel according to claim 6, wherein the touch layer further comprises:

a third insulating sub-layer disposed between the second metal sub-layer and the first metal sub-layer, the third insulating sub-layer comprising an inorganic insulating material, the first insulating sub-layer comprising an organic insulating material, the first insulating sub-layer is only disposed in the non-display area and does not overlap with the third insulating sub-layer;

wherein the first metal sub-layer comprises a plurality of touch electrodes disposed in the display area;

wherein the third insulating sub-layer comprises a plurality of fourth wiring holes, and part of the touch electrodes are electrically connected to the corresponding touch leads through the fourth wiring holes.

8. The display panel according to claim 6, wherein the first insulating sub-layer further covers the display area and is disposed between the second metal sub-layer and the first metal sub-layer, the first insulating sub-layer further comprises a fifth wiring hole disposed in the third wiring hole close to the display area;

wherein the first metal sub-layer comprises a plurality of touch electrodes disposed in the display area, and part of the touch electrodes are electrically connected to the corresponding touch leads through the fifth wiring hole.

9. The display panel according to claim 1, wherein in the surface of the organic insulating portion away from the substrate, the roughness of the surface of the area not covered by the encapsulation layer is greater than the roughness of the surface of the area covered by the encapsulation layer.

10. A display panel comprising a display area and a non-display area disposed on a side of the display area, wherein the display panel comprises:

a substrate;

an inorganic insulating layer disposed on a surface of the substrate, the inorganic insulating layer comprising a first groove disposed in the non-display area;

an organic insulating layer disposed on a surface of the inorganic insulating layer away from the substrate and is disposed in the display area and extends into the non-display area, the organic insulating layer comprising a barrier disposed between the first groove and the display area, an organic insulating portion disposed on a side of the barrier away from the display area, a second groove disposed between the barrier and the organic insulating portion and disposed in the organic insulating layer, and a first wiring hole disposed in the organic insulating portion and located on a side of the first groove close to the display area;

a light emitting layer disposed on a surface of the organic insulating layer away from the substrate and corresponding to the display area;

an encapsulation layer disposed on a surface of the light emitting layer away from the substrate, the encapsulation layer being disposed in the display area and extending to the non-display area, the encapsulation layer covering a part of the organic insulating portion and not extending to the first wiring hole; and a touch layer disposed on a surface of the encapsulation layer away from the substrate, the touch layer comprising a first insulating sub-layer and a first metal sub-layer, the first insulating sub-layer covering a part of the encapsulation layer and a part of the organic insulating portion, the first insulating sub-layer comprising a second wiring hole corresponding to the first wiring hole, the first metal sub-layer comprising a plurality of touch wirings, the touch wirings being disposed on a surface of the first insulating sub-layer away from the substrate and extending to the second wiring hole.

11. The display panel according to claim 10, wherein the encapsulation layer comprises a first side surface close to the first wiring hole;

wherein the first insulating sub-layer comprises a stepped slope corresponding to the first side surface;

wherein a first angle is formed between the first side surface and the substrate;

wherein a second angle is formed between the stepped slope and the substrate;

wherein the first angle and the second angle are both less than 90 degrees, and the first angle is greater than the second angle.

12. The display panel according to claim 11, wherein a thickness of the first insulating sub-layer located at the stepped slope close to the display area is greater than a thickness of the first insulating sub-layer located at the stepped slope away from the display area.

13. The display panel according to claim 11, wherein the touch layer further comprises:

a second insulating sub-layer disposed on a surface of the encapsulation layer away from the substrate, the second insulating sub-layer being disposed in the display area and extending to the non-display area, the outer boundary of the second insulating sub-layer in the non-display area does not exceed the boundary of the encapsulation layer;

wherein the first insulating sub-layer covers a part of the second insulating sub-layer and a part of the organic insulating portion.

14. The display panel according to claim 13, wherein the second insulating sub-layer comprises an inorganic insulating material, and the first insulating sub-layer comprises an organic insulating material.

15. The display panel according to claim 13, wherein the touch layer further comprises:

a second metal sub-layer disposed on a surface of the second insulating sub-layer away from the substrate, the second metal sub-layer comprising a plurality of touch leads;

wherein the first insulating sub-layer covers at least part of the touch leads, the first insulating sub-layer comprises a third wiring hole disposed between the stepped slope and the display area, one end of the touch lead extends to the display area and the other end extending to the third wiring hole, at least part of the touch wirings is electrically connected to the corresponding touch leads through the third wiring hole.

16. The display panel according to claim 15, wherein the touch layer further comprises:

a third insulating sub-layer disposed between the second metal sub-layer and the first metal sub-layer, the third insulating sub-layer comprising an inorganic insulating material, the first insulating sub-layer comprising an organic insulating material, the first insulating sub-layer is only disposed in the non-display area and does not overlap with the third insulating sub-layer;

wherein the first metal sub-layer comprises a plurality of touch electrodes disposed in the display area;

wherein the third insulating sub-layer comprises a plurality of fourth wiring holes, and part of the touch electrodes are electrically connected to the corresponding touch leads through the fourth wiring holes.

17. The display panel according to claim 15, wherein the first insulating sub-layer further covers the display area and is disposed between the second metal sub-layer and the first metal sub-layer, the first insulating sub-layer further comprises a fifth wiring hole disposed in the third wiring hole and close to the display area;

wherein the first metal sub-layer comprises a plurality of touch electrodes disposed in the display area, and part of the touch electrodes are electrically connected to the corresponding touch leads through the fifth wiring hole.

18. The display panel according to claim 11, wherein the first angle ranges from 75° to 90°, and the second angle ranges from 30° to 60°.

19. The display panel according to claim 10, wherein in the surface of the organic insulating portion away from the substrate, the roughness of the surface of the area not covered by the encapsulation layer is greater than the roughness of the surface of the area covered by the encapsulation layer.

20. A display device comprising a display panel, wherein the display panel comprises a display area and a non-display area disposed on a side of the display area, the display panel comprises:

a substrate;

an inorganic insulating layer disposed on one surface of the substrate, the inorganic insulating layer comprising a first groove disposed in the non-display area;

an organic insulating layer disposed on a surface of the inorganic insulating layer away from the substrate and is disposed in the display area and extends into the non-display area, the organic insulating layer comprising a barrier disposed between the first groove and the display area, an organic insulating portion disposed on a side of the barrier away from the display area, a second groove disposed between the barrier and the organic insulating portion and disposed in the organic insulating layer, and a first wiring hole disposed in the organic insulating portion and located on a side of the first groove close to the display area;

a light emitting layer disposed on a surface of the organic insulating layer away from the substrate and corresponding to the display area;

an encapsulation layer disposed on a surface of the light emitting layer away from the substrate, the encapsulation layer being disposed in the display area and extending to the non-display area, the encapsulation layer covering a part of the organic insulating portion and not extending to the first wiring hole; and a touch layer disposed on a surface of the encapsulation layer away from the substrate, the touch layer comprising a first insulating sub-layer and a first metal sub-layer, the first insulating sub-layer covering a part of the encapsulation layer and a part of the organic insulating portion, the first insulating sub-layer comprising a second wiring hole corresponding to the first wiring hole, the first metal sub-layer comprising a plurality of touch wirings, the touch wirings being disposed on a surface of the first insulating sub-layer away from the substrate and extending to the second wiring hole.

* * * * *